(12) United States Patent
Tamon (10) Patent No.: US 7,983,083 B2
(45) Date of Patent: Jul. 19, 2011

(54) SEMICONDUCTOR DEVICE

(75) Inventor: Susumu Tamon, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 84 days.

(21) Appl. No.: 12/472,004

(22) Filed: May 26, 2009

(65) Prior Publication Data

US 2009/0290403 A1 Nov. 26, 2009

(30) Foreign Application Priority Data

May 26, 2008 (JP) ................ P2008-136566

(51) Int. Cl.
*G11C 11/34* (2006.01)
(52) U.S. Cl. ............. 365/185.11; 365/185.17; 365/63
(58) Field of Classification Search ........... 365/185.11, 365/185.17, 63
See application file for complete search history.

(56) References Cited

U.S. PATENT DOCUMENTS

2007/0138535 A1* 6/2007 Higashitani ............ 257/315

FOREIGN PATENT DOCUMENTS

| JP | 6-61458 | 3/1994 |
|---|---|---|
| JP | 9-17974 | 1/1997 |
| JP | 9-45087 | 2/1997 |
| JP | 2000-183307 | 6/2000 |
| JP | 2008-47904 | 2/2008 |

* cited by examiner

*Primary Examiner* — Huan Hoang
(74) *Attorney, Agent, or Firm* — Oblon, Spivak, McClelland, Maier & Neustadt, L.L.P.

(57) ABSTRACT

According to an aspect of the present invention, there is provided a semiconductor device including: first and second blocks that each includes a word line group of first to N-th word lines, the word lines extending in a given direction, the word lines having a first width, the first and second blocks being adjacent to and in parallel with each other in a crossing direction so that an inter-block area is interposed therebetween and so that the word line groups are symmetrical with respect to the inter-block area; and a first wirings that are formed in a first wiring layer positioned above the word lines to have a second width wider than the first width and that connect a k-th word line of the first block and a k-th word line of the second block.

20 Claims, 10 Drawing Sheets

SEMICONDUCTOR DEVICE

CROSS-REFERENCE TO RELATED APPLICATIONS

This application claims priority from Japanese Patent Application No. 2008-136566 filed on May 26, 2008, the entire contents of which are incorporated herein by reference.

BACKGROUND OF THE INVENTION

1. Field of the Invention

An aspect of the present invention relates to a semiconductor device having a structure for applying a voltage to a word line connected to a memory cell.

2. Description of the Related Art

In a semiconductor memory device, bit lines and word lines are arranged to extend to intersect each other, and a memory cell is provided in each intersectional region in which an associated one of the bit lines and that of the word lines intersect each other. The word lines extend across a memory cell area including a memory cell array along a given direction, and a voltage is applied to each memory cell through the word lines (see, e.g., JP-2008-047904-A). In JP-2008-047904-A, leakage current between adjacent word lines is suppressed by appropriately forming an end portion of each word line. However, with the recent micro-patterning of the memory cell and the reduction of the design rule thereof, there is a tendency that a word line width is decreased. In addition, according to the specifications of products, it is necessary to lengthen a word line length still more. In this case, the propagation delay of a signal easily occurs, thereby decreasing the speed of writing data to a memory cell.

SUMMARY OF THE INVENTION

According to an aspect of the present invention, there is provided a semiconductor device including: first and second blocks that each includes a word line group of first to N-th word lines, N being integer equal to or larger than 2, the word lines extending in a given direction in parallel with one another in a crossing direction intersecting with the given direction, the word lines having a first width, the first and second blocks being adjacent to and in parallel with each other in the crossing direction so that an inter-block area is interposed therebetween and so that the word line groups are symmetrical with respect to the inter-block area; and a plurality of first wirings that are formed in a first wiring layer positioned above the word lines to have a second width wider than the first width and that connect a k-th word line of the first block and a k-th word line of the second block, k being integer equal to or larger than 1 and lower than or equal to N.

According to another aspect of the present invention, there is provided a semiconductor device including: a semiconductor substrate; a first block including: a plurality of first memory cell transistors arranged in matrix; and a plurality of first word lines connecting the first memory cell transistors in a first direction; a second block including: a plurality of second memory cell transistors that are adjacent to the first block in a second direction intersecting the first direction and that are arranged in matrix; and a plurality of second word lines connecting the second memory cell transistors in the first direction; and a plurality of first wirings that are formed in a first wiring layer positioned above the first wiring lines and the second word lines and that respectively connect a k-th one of the first word lines and a k-th one of the second word lines, k being integer equal to or larger than 1 and lower than or equal to N.

DETAILED DESCRIPTION OF THE INVENTION

As a semiconductor device according to an embodiment of the invention, a NAND flash memory device is described with reference to the accompanying drawings. In the drawings to be referred to in the following description, the same or similar reference numerals designate the same or similar parts. The drawings are schematic, and the ratio between the thickness and the planar dimension of each part, and the rate among the thicknesses of layers differ from actual ones, for example.

Figure 1:
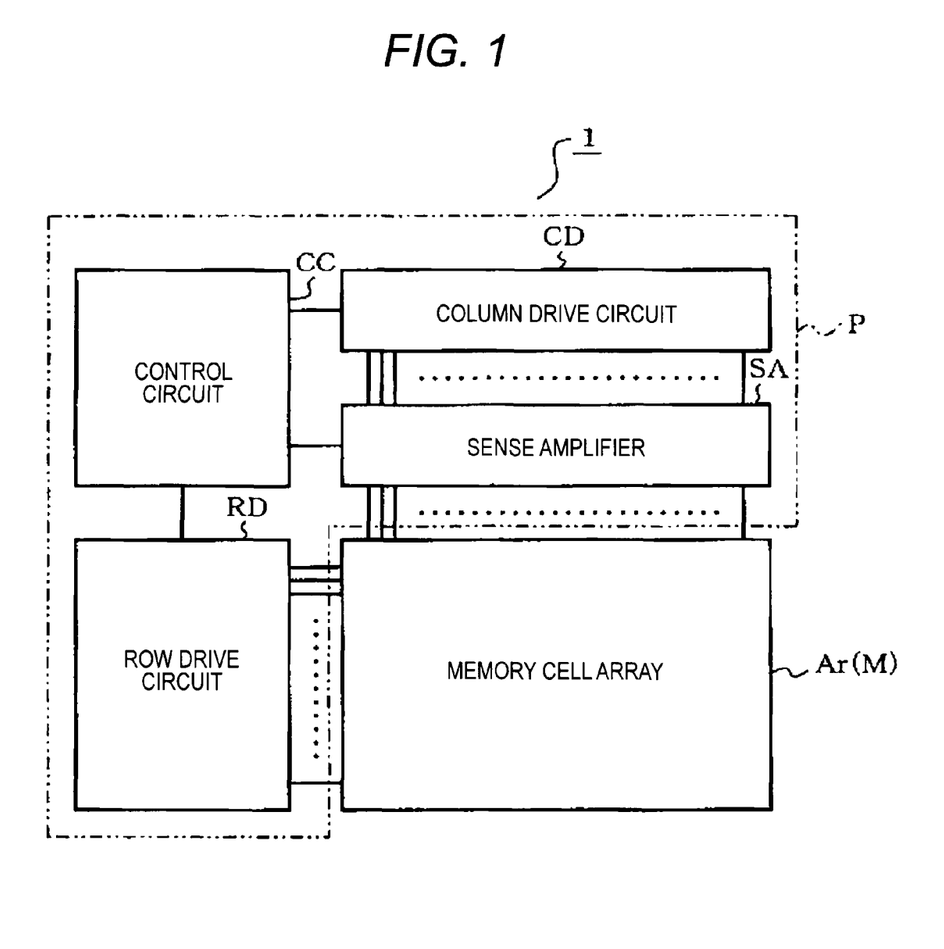
FIG. 1 is a schematic diagram illustrating the electrical configuration of a flash memory according to an embodiment of the invention.

FIG. 1 schematically illustrates the electrical configuration of a NAND flash memory device according to the embodiment. As illustrated in FIG. 1, the flash memory device 1 includes a memory cell area M and a peripheral circuit area P. A memory cell array Ar constructed by providing a large number of matrix-arranged memory cells is provided in the memory cell area M. The peripheral circuit area P is provided with peripheral circuits, such as a control circuit CC, a row drive circuit RD, a column drive circuit CD, and a sense amplifier SA, for reading data from each memory cell of the memory cell array Ar, writing data to each memory cell, and deleting data from each memory cell. The memory cell array Ar is constructed in the memory cell area M, and the peripheral circuits are constructed in the peripheral circuit area P. Although the single memory cell array Ar is shown in FIG. 1, the memory cell array Ar being divided into a plurality of planes can be used.

Figure 2:
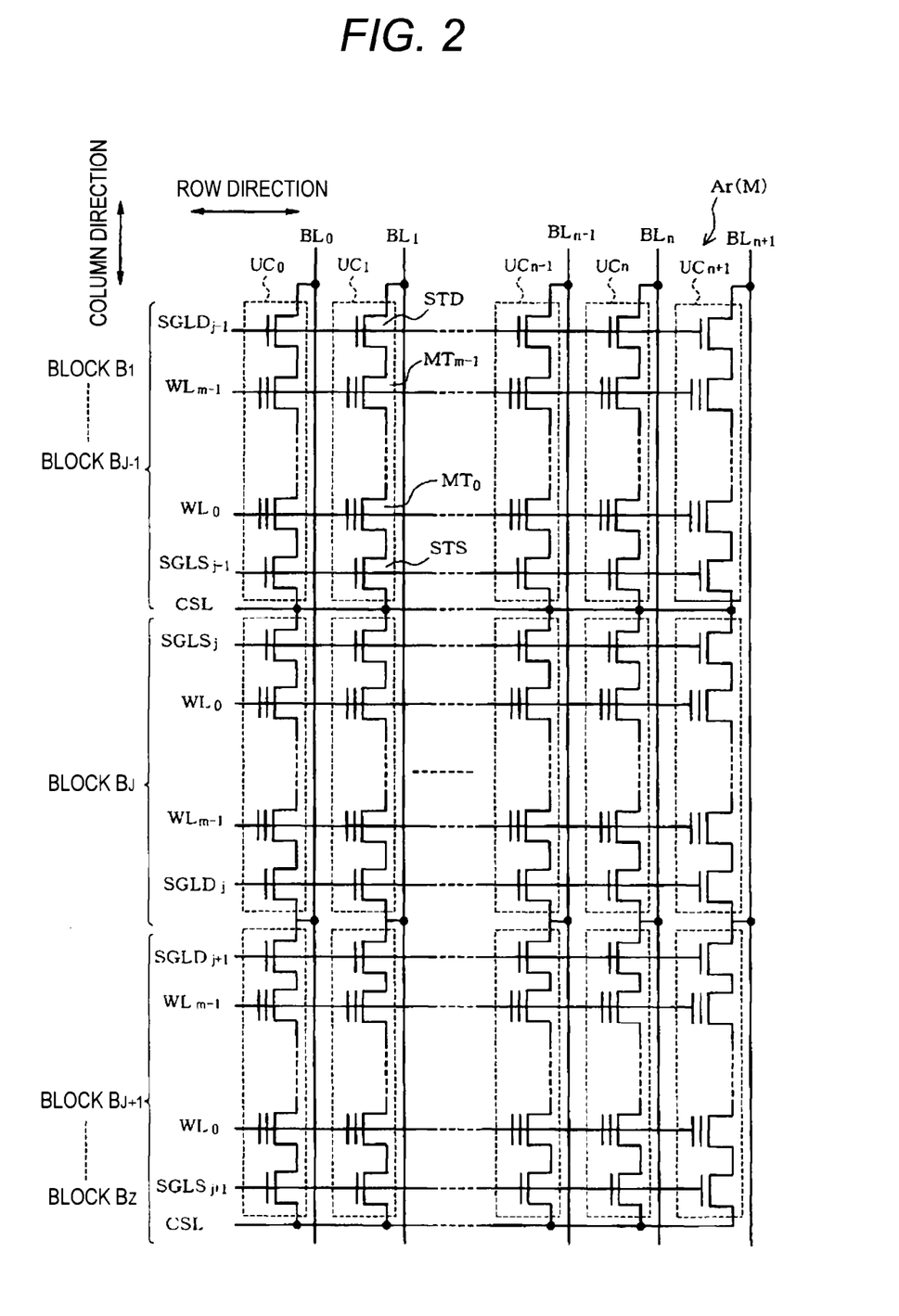
FIG. 2 is a schematic diagram illustrating the internal electrical configuration of a memory cell array.
Figure 3:
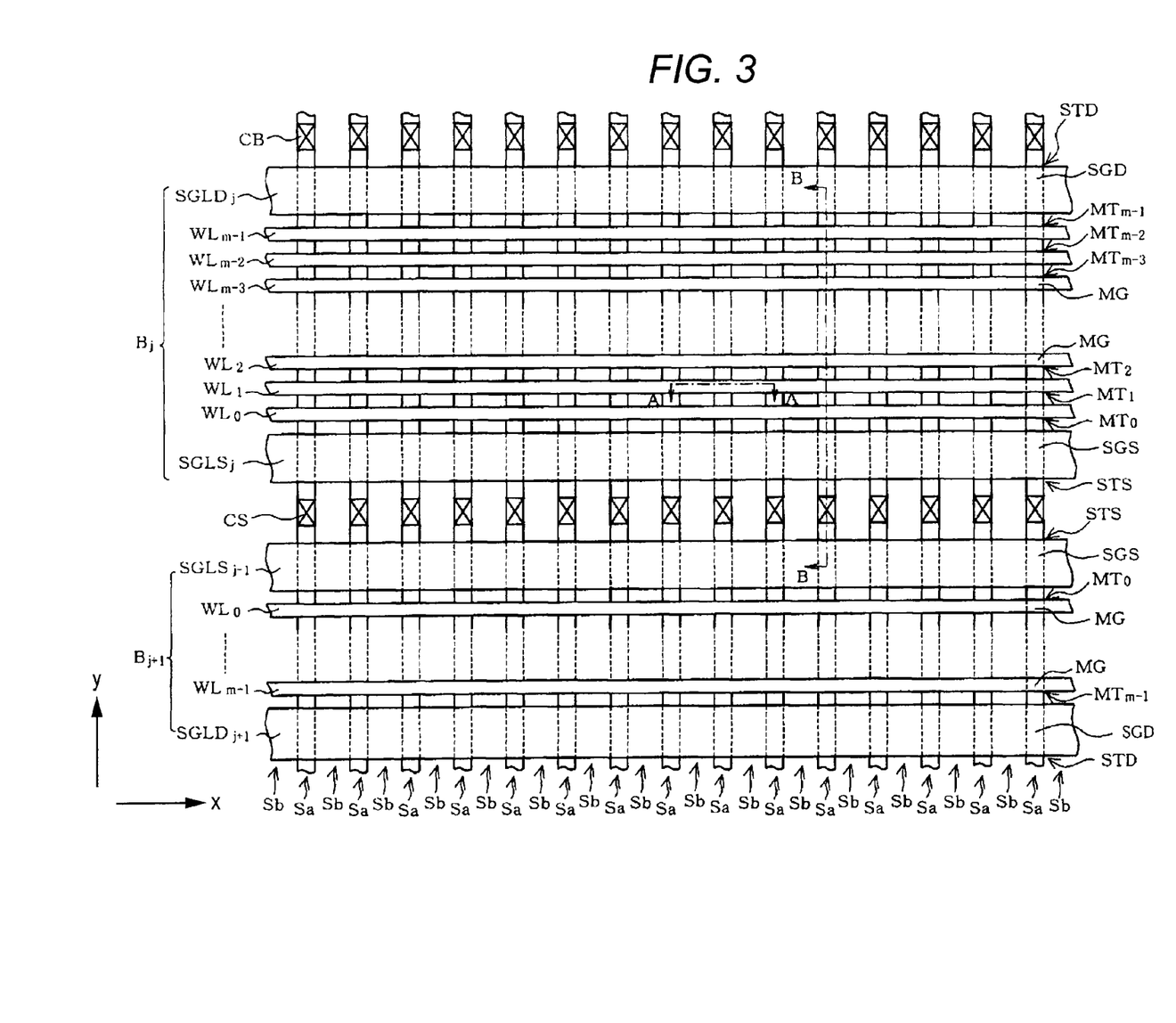
FIG. 3 is a plan diagram schematically illustrating the memory cell.

Next, the schematic configuration of the memory cell array is described with reference to FIGS. 2 and 3. FIG. 2 schematically illustrates the internal electrical configuration of the memory cell array. FIG. 3 schematically illustrates a plan view of the memory cell array.

As illustrated in FIG. 2, in the memory cell area M, the memory cell array Ar is constructed by providing a large number of cell units UC (NAND cell units) in a matrix-like arrangement. Each of the cell units UC ($UC_0$ to $UC_{n+1}$) includes a (drain-side) select gate transistor STD connected to an associated one of bit lines BL ($BL_0$ to $BL_{n+1}$), a (source-side) select gate transistor STS connected to an associated one of source lines CSL, and a plurality (e.g., $m^k$ (=32 in a case where m=2 and k=5)) of memory cell transistors MT ($MT_0$ to $MT_{m-1}$) series-connected between the two (or plural) select gate transistors STS and STD.

Each single block ($B_j$) is constructed by arranging (n+2)-columns of these cell units UC in parallel with one another in a row direction. The memory cell array Ar is constructed by arranging a plurality of columns (i.e., z-columns) of blocks $B_1, \ldots, B_j, B_{j+1}, \ldots,$ and $B_z$ in a column direction.

As illustrated in FIG. 3, in the cell units UC arranged in the row direction, the gate electrodes SGD of the select gate transistors STD are electrically connected to one another by a select gate line SGLD, and the drain regions of the select gate transistors STD are connected to bit line contacts CB, respectively. These bit line contacts CB are connected to bit lines BL (see FIG. 2) extending in Y-direction (i.e., a bit line direction) intersecting perpendicularly with X-direction (i.e., a word line direction) shown in FIG. 3.

In the cell units UC arranged in the row direction, the gate electrodes SGS of the select gate transistors STS are electrically connected to one another by a select gate line SGLS, and the sources of the select gate transistors STS are connected to a source line CSL in common shown in FIG. 2 via source line contacts CS.

In the cell units UC arranged in the row direction, the gate electrodes MG of the memory cell transistors MT ($MT_0$ to $MT_{m-1}$) are electrically connected to one another by the word lines WL (WL0 to WLm−1). The word lines WL (WL0 to WLm−1) provided in each one block $B_j$ are functioning as the word line group. The sense amplifier SA illustrated in FIG. 1 is connected to the bit lines BL ($BL_0$ to $BL_{n+1}$) shown in FIG. 2. The memory cell array Ar is configured to be connected to a latch circuit for temporarily storing data when the data is read.

Figure 4:
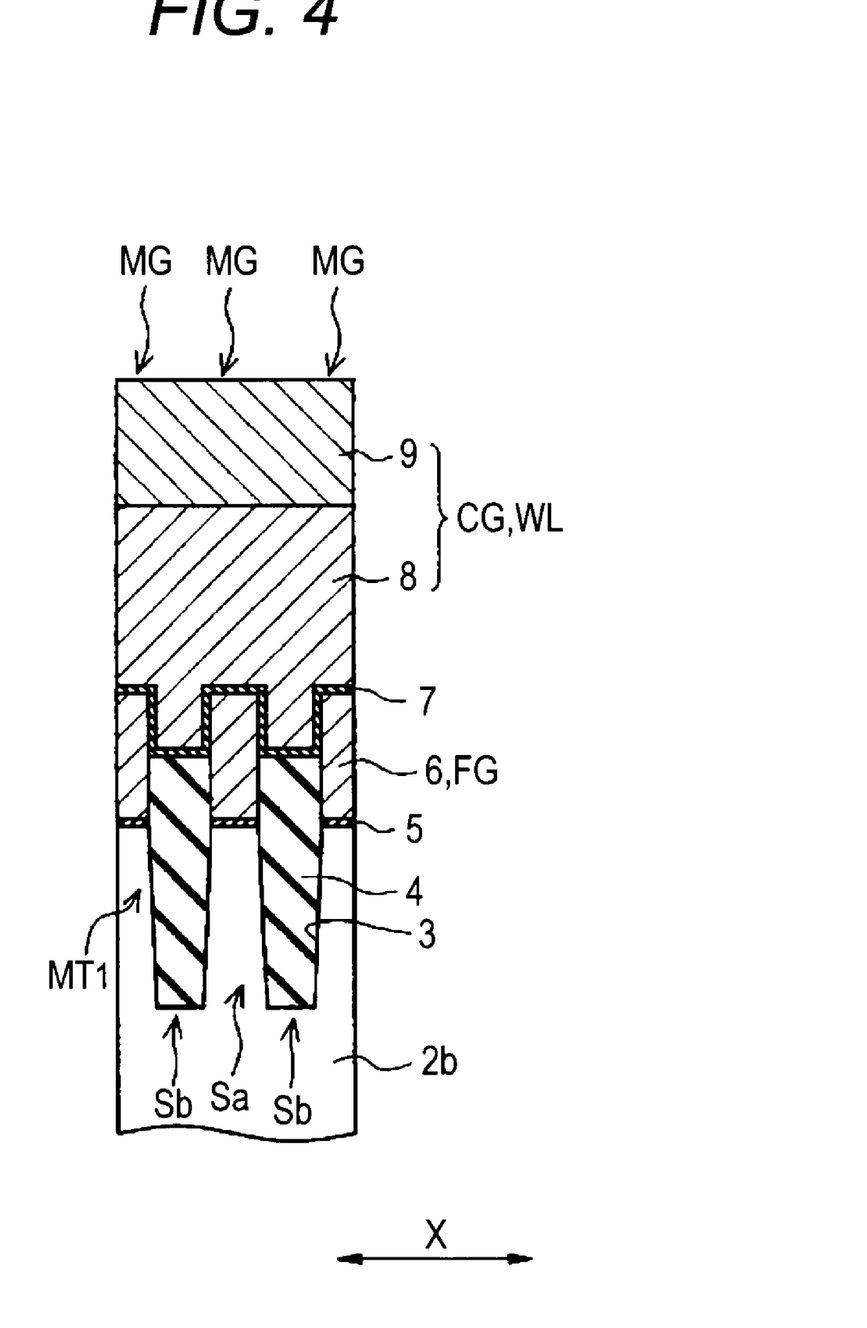
FIG. 4 is a vertical cross-sectional diagram illustrating the structure of the memory cell array along a direction in which a word line extends (a vertical cross-sectional diagram taken along line A-A shown in FIG. 3).
Figure 5:
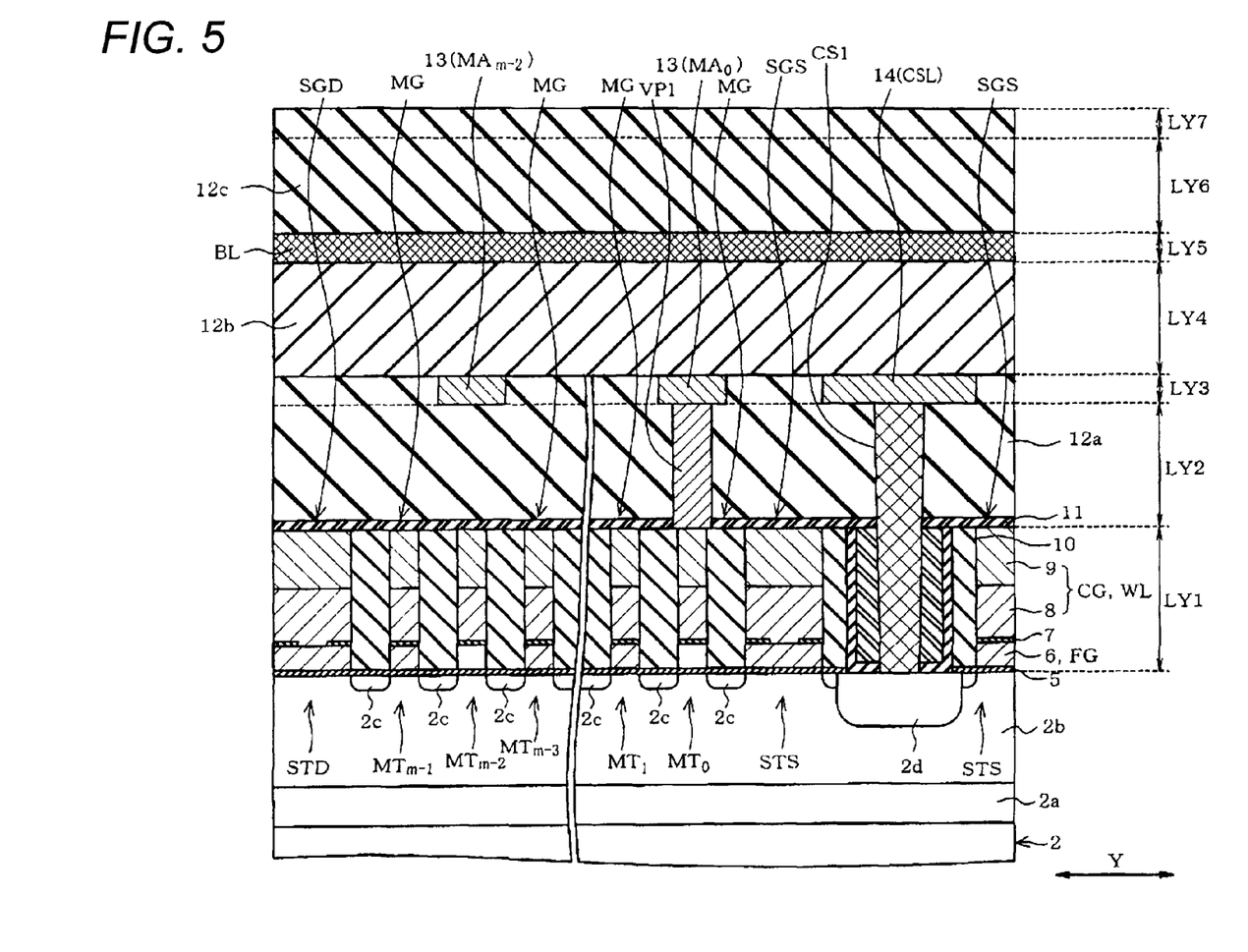
FIG. 5 is a vertical cross-sectional diagram illustrating the structure of the memory cell array along a direction in which active areas extend (a vertical cross-sectional diagram taken along line B-B shown in FIG. 3).

FIG. 4 illustrates the vertical cross-sectional structure of the memory cell array along a direction in which the word lines extend (i.e., FIG. 4 is a cross-sectional diagram taken along line A-A shown in FIG. 3). FIG. 5 illustrates the vertical cross-sectional structure of the memory cell array along a direction in which active areas extend (i.e., FIG. 5 is a cross-sectional diagram taken along line B-B shown in FIG. 3).

As illustrated in FIG. 5, an N-well 2a is formed in a surface layer of a semiconductor substrate 2, and a P-well 2b is formed in a surface layer of this N-well 2a. As illustrated in FIG. 4, an element isolation region Sb of a shallow trench isolation (STI) structure is formed in an upper portion of the P-well 2b. A plurality of element isolation regions Sb are formed to extend in Y-direction at given interval in X-direction. Consequently, as illustrated in FIG. 3, a plurality of active areas Sa are configured so as to be isolated from one another. In each element isolation groove 3, an element isolation film 4 is formed of, e.g., a silicon dioxide film.

On the top surfaces of the semiconductor substrate 2 that are divided by the element isolation groove 3, a gate insulating film 5 is formed. The gate insulating film 5 is formed of, e.g., a silicon dioxide film. A polycrystalline silicon film 6 is formed on the top surface of the gate insulating film 5. The polycrystalline silicon film 6 functions as a floating gate electrode FG. The element isolation film 4 is configured to have the top surface placed higher than the top surface of the gate insulating film 5 and lower than the top surface of the polycrystalline silicon film 6. The element isolation film 4 is formed to be in contact with a lower part of a side surface of the polycrystalline silicon film 6 and with a side surface of the gate insulating film 5.

An inter-gate insulating film 7 is formed on the top surface and the side surface of the polycrystalline silicon layer 6 and the top surface of the element isolation film 4. The inter-gate insulating film 7 is formed of, e.g., an oxide-nitride-oxide (ONO) film. The inter-gate insulating film 7 may be formed of a nitride-oxide-nitride-oxide-nitride (NONON) film obtained by the radical nitriding of an ONO film before or after the formation of the ONO film, or of a nitride-oxide-alumina-oxide-nitride (NOAON) film obtained by sandwiching alumina ($Al_2O_3$) between the laminated structures of an oxide film and a nitride film.

A control gate electrode CG is formed on the inter-gate insulating film 7. The control gate electrode CG includes a polycrystalline silicon layer 8 and a metal silicide layer 9 formed thereon through a silicidation process using a metal, such as tungsten (W), cobalt (Co), and Nickel (Ni). The control gate electrode constitutes each word line WL ($WL_0$ to $WL_{m-1}$). Thus, the gate electrodes MG of the memory cell transistors MT ($MT_0$ to $MT_{m-1}$) are formed to each have a stacked gate structure in which the polycrystalline silicon layer 6, the inter-gate insulating film 7 and the control gate electrode CG are stacked.

As illustrated in FIG. 4, the word lines WL ($WL_0$ to $WL_{m-1}$) are formed so as to extend in X-direction on the active areas Sa and the element isolation regions Sb extending in Y-direction and on the floating gate electrodes FG separately arranged in X-direction. The word lines WL connect the gate electrodes MG of the memory cell transistors MT in X-direction.

As illustrated in FIG. 3, the select gate electrodes SGD of the select gate transistors STD are formed on the active areas Sa at portions intersecting with the select gate lines SGLD so as to be connected with the associated one of the select gate line SGLD. The select gate electrodes SGS of the select gate transistors STS are formed on the active areas Sa at portions intersecting with the select gate lines SGLS so as to be connected with the associated one of the select gate line SGLS.

Next, the cross-sectional structure formed along a direction, in which the active areas extend, is described below with reference to FIG. 5.

As illustrated in FIG. 5, a structure above the semiconductor substrate includes layers LY1 to LY7, for example. For example, a gate insulating film 5, an inter-electrode insulating film 10, and gate electrodes FG and CG are formed in the layer LY1. A first inter-layer insulating film 12a, a via-plug VP1, and a barrier film 11 are formed in the layer Y2. A word line connection wiring 13 and a source line connection wiring 14 are formed in a groove formed in the top surface of the first inter-layer insulating film 12a in the layer LY3. A second inter-layer insulating film 12b is formed in the layer LY4. The bit line BL is formed in the layer LY5. A third inter-layer insulating film 12c is formed in the layers LY6 and LY7. A wiring 15 to be described below is formed in the layer LY7.

The select gate electrode SGD of the select gate transistor STD and the select gate electrode SGS of the select gate transistor STS are formed in the layer LY1 on the P-well 2b of the semiconductor substrate 2 via the gate insulating film 5. The gate electrodes MG of the memory cell transistors MT are provided on the semiconductor substrate 2 via the gate insulating film 5 and arranged along Y-direction between the select gate electrodes SGD and SGS.

The select gate electrodes SGD of the select gate transistors STD and the select gate electrodes SGS of the select gate transistors STS have a structure similar to that of the gate electrode MG of the memory cell transistor MT. In each of the select gate electrodes SGD and SGS, an opening is formed in the inter-gate insulating film 7 so as to electrically connect the polycrystalline silicon layers 6 and 8 through the opening.

Impurity diffusion layers 2c serving as source/drain regions are formed in the surface layer of the semiconductor substrate 2 between the gate electrodes MG and MG, between the gate electrode MG and the select gate electrode SGD, and between the gate electrode MG and the select gate electrode SGS, respectively. A high-concentration impurity diffusion layer 2d is formed in a surface layer of the semiconductor substrate 2 between the select gate electrodes SGS and SGS, as a contact region. A lower layer source line contact CS1 is formed in the layers LY1 to LY2 on the impurity diffusion layer 2d. A wiring 14 serving as a local source line is formed in the layer LY3 on the lower layer source line contact CS1.

An inter-electrode insulating film 10 constituted by, e.g., a silicon oxide film is formed in the layer LY1 between the gate electrodes MG and MG, between the gate electrode MG and the select gate electrode SGD, and between the gate electrode MG and the select gate electrode SGS, respectively.

A barrier film 11 constituted by a silicon nitride film is formed in the layer LY2 on the inter-electrode insulating film 10, and the gate electrodes SG and MG. A first inter-layer insulating film 12a constituted by, e.g., a silicon oxide film is formed on the barrier film 11.

A via-plug VP1 is formed in the layer LY2 so as to be connected to the gate electrode MG of the memory cell transistor $MT_0$. In this via-plug VP1, a wiring material, e.g., tungsten (W) is formed via a barrier metal.

The wirings 13 are constructed in the layer LY3 on the top surface of the via-plug VP1. In a cross-section taken in Y-direction illustrated in FIG. 5, each of the wirings 13 has a width wider than that of the via-plug VP1 and the gate electrodes MG the memory cell transistors $MT_0$. A wiring 14 is formed in the layer LY3 on the top surface of the source line contact CS1. The wiring 14 is formed of the same material as that of the wiring 13.

As will be described below, the via-plug VP1 and the wiring 13 are provided so as to structurally and electrically connect the word lines WL ($WL_0$ to $WL_{m-1}$) having the same number among the word lines WL ($WL_0$ to $WL_{m-1}$) of the adjacent blocks $B_j$ and $B_{j+1}$.

The wirings 13 are formed in the layer LY3 not only on the gate electrode MG of the memory cell transistor $MT_0$ but also on the gate electrodes MG of the memory cell transistors $MT_2, MT_4, \ldots MT_{m-2}$ alternately selected from all the word lines WL ($WL_0$ to $WL_{m-1}$). The wirings 13 corresponding to the gate electrodes MG of the memory cell transistors $MT_2$, $MT_4, \ldots MT_{m-2}$ are each connected to an associated one of the gate electrodes MG by the via-plug VP1 at a position shifted from a sheet plane of FIG. 5 in a depth direction.

The second inter-layer insulating film 12b is formed in the layer LY4 on the wirings 13 and 14. The bit line BL is formed in the layer LY5 on the inter-layer insulating film 12b. As shown in FIG. 3, the bit line contact CB is formed between the select gate electrodes SGD of the block $B_j$ and the select gate electrodes SGD of the block $B_{j+1}$, and the bit line BL is connected to the drain region of the select gate transistor STD through the bit line contact CB.

The wirings 13 are connected to an upper layer wiring provided in the layer LY7 in a source shunt region that will be described below. The wiring 14 is connected to an upper layer source line via the contact provided in the source shunt region.

Figure 6:
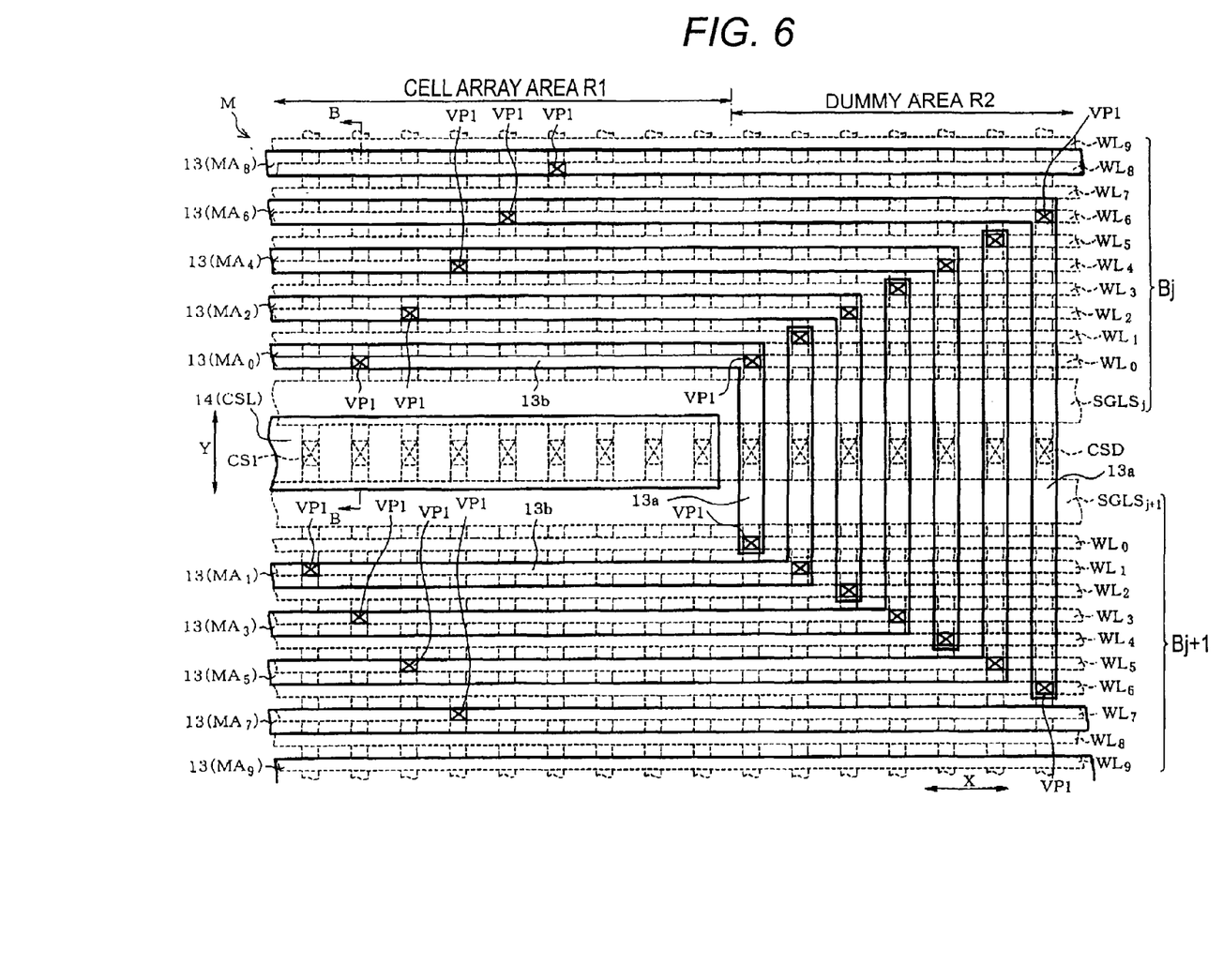
FIG. 6 is a plan diagram schematically illustrating a word line connection structure in a memory cell end area.

Hereinafter, the connection relationship among the word lines is described. FIG. 6 schematically illustrates a planar structure of each of the layers LY2 and LY3, in which the via-plugs VP1 and the wirings 13 and 14 are formed, at an end part of a memory cell area. The memory cell area M is partitioned in X-direction (i.e., a word line extending direction) shown in FIG. 6 into a cell array area R1, in which cell units UC are formed, and a dummy area R2 provided to assure the structural periodicity of the gate electrodes in the cell array area R1. The dummy area R2 is provided to provide a gate electrode structure with high periodicity, thereby ensuring a lithography processing margin.

Although the structure of the gate electrodes MG, SGD, and SGS of the cell units UC is provided in the dummy area R2, these electrodes are constructed as dummy cell units, and do not function as substantial electric components of the memory cell units. As illustrated in FIG. 6, in the dummy area R2 provided in an end portion of the memory cell area M, the word lines WL of the blocks $B_j$ and $B_{j+1}$ are structurally and electrically connected across an area (hereunder referred to as a dummy contact area), in which the dummies of the source line contacts CS are formed. Although FIG. 6 exemplary illustrates the position of the boundary between the cell array R1 and the dummy area R2, it is not limited thereto.

As illustrated in FIG. 6, in the layers LY2 and LY3, the wiring 14 is constructed to cover the top surfaces of the source line contacts CS (CS1). In addition, connection portions 13a of the wirings 13 are constructed so as to structurally and electrically connect the word lines WL ($WL_0$ to $WL_{m-1}$) between the adjacent blocks $B_j$ and $B_{j+1}$ in the dummy area R2.

As illustrated in FIG. 6, the connection portions 13a of the wirings 13 ($MA_0$ to $MA_{m-1}$) are provided. The connection portions 13a are formed to be spaced from one another in X-direction and to linearly extend along Y-direction above the dummy contact area CSD in the dummy area R2. The via-plugs VP1 that extend perpendicularly to the substrate surface are provided at both end portions of the connection portions 13a. Each of the wirings 13 ($MA_0$ to $MA_{m-1}$) is electrically connected to an associated pair of the word lines WL ($WL_0$ to $WL_{m-1}$, the control gate electrodes CG) having the same number of the adjacent blocks $B_j$ and $B_{j+1}$.

In the block $B_j$, the wiring $MA_0$ has the connection portion 13a that extends in Y-direction in the dummy area R2 and the extending portion 13b that is perpendicularly bent to X-direction from one end of the connection portion 13a in which the via lug VP1 is formed and that extends toward the cell array area R1 above the word line $WL_0$.

Similarly, in the block $B_j$, each of other even-numbered wirings $MA_2 \ldots$ has the connection portion 13a formed in the dummy area R2 and the extending portion 13b formed so as to extend in X-direction above the associated even-numbered word line $WL_2 \ldots$ toward the cell array area R1 from the one end of the connection portion 13a in which the via lug VP1 is formed.

As illustrated in FIG. 6, in the block $B_{j+1}$, the wiring MA1 has a connection portion 13a formed in the dummy area R2 and an extending portion 13b formed so as to extend in X-direction above the word line $WL_1$ toward the cell array area R1 from one end of the connection portion 13a in which the via-plug VP1 is formed.

Similarly, in the block $B_{j+1}$, each of other odd-numbered wirings $MA_3 \ldots$ has the connection portion 13a formed in the dummy area R2 and the extending portion 13b formed so as to extend in X-direction above the associated odd-numbered word line $WL_3$ . . . toward the cell array area R1 from the one end of the connection portion 13a in which the via plug VP1 is formed.

The extending portion 13b of each of the wirings 13 ($MA_0$ to $MA_{m-1}$) is formed to have the width in Y-direction wider (e.g., twice wider) than that of each of the word lines WL ($WL_0$ to $WL_{m-1}$).

In the adjacent blocks $B_j$ and $B_{j+1}$, the even-numbered wirings $MA_0$ . . . are formed so as to extend in X-direction in the one block $B_j$, the odd-numbered wirings MA1 . . . are formed so as to extend in X-direction in the other block $B_{j+1}$, and the wiring width in Y-direction of the wiring $MA_0$ . . . is wider than that of the word lines WL. In this case, the design rules for the wirings $MA_0$ . . . can be relaxed such that the wirings have a wider pitch (e.g., a double pitch of that for the word lines WL). Further, by increasing the width of each wiring $MA_0$ . . . , even when misalignment in Y-direction is caused in lithography processing, each wiring $MA_0$ . . . can surely be contacted with the via-plug VP1, thereby enhancing the reliability of the wiring connection.

Each of the wirings 13 ($MA_0$ to $MA_{m-1}$) is formed so as to extend in X-direction above one of the word lines WL ($WL_0$ to $WL_{m-1}$) having the same number therewith. In the cell array area R1, each of the word lines WL ($WL_0$ to $WL_{m-1}$) is structurally and electrically connected to the associated wiring 13 by the via-plugs VP1 periodically provided along X-direction.

As the wiring length in X-direction increases, the resistance of the wiring 13 becomes high. Particularly, at an end portion of the memory cell area M, a propagation delay is caused due to the resistance and the floating capacity. Therefore, in the cell array area R1, the word lines WL and the wirings 13 are periodically connected by the via-plugs VP1 to decrease the impedance of the wirings 13 and to uniform voltage in each word line WL ($WL_0$ to $WL_{m-1}$). It is unnecessary to provide the via-plugs VP1 exactly at the same cycle.

Next, a switching structure of the wirings 13 in a source shunt area is described below.

Figure 7:
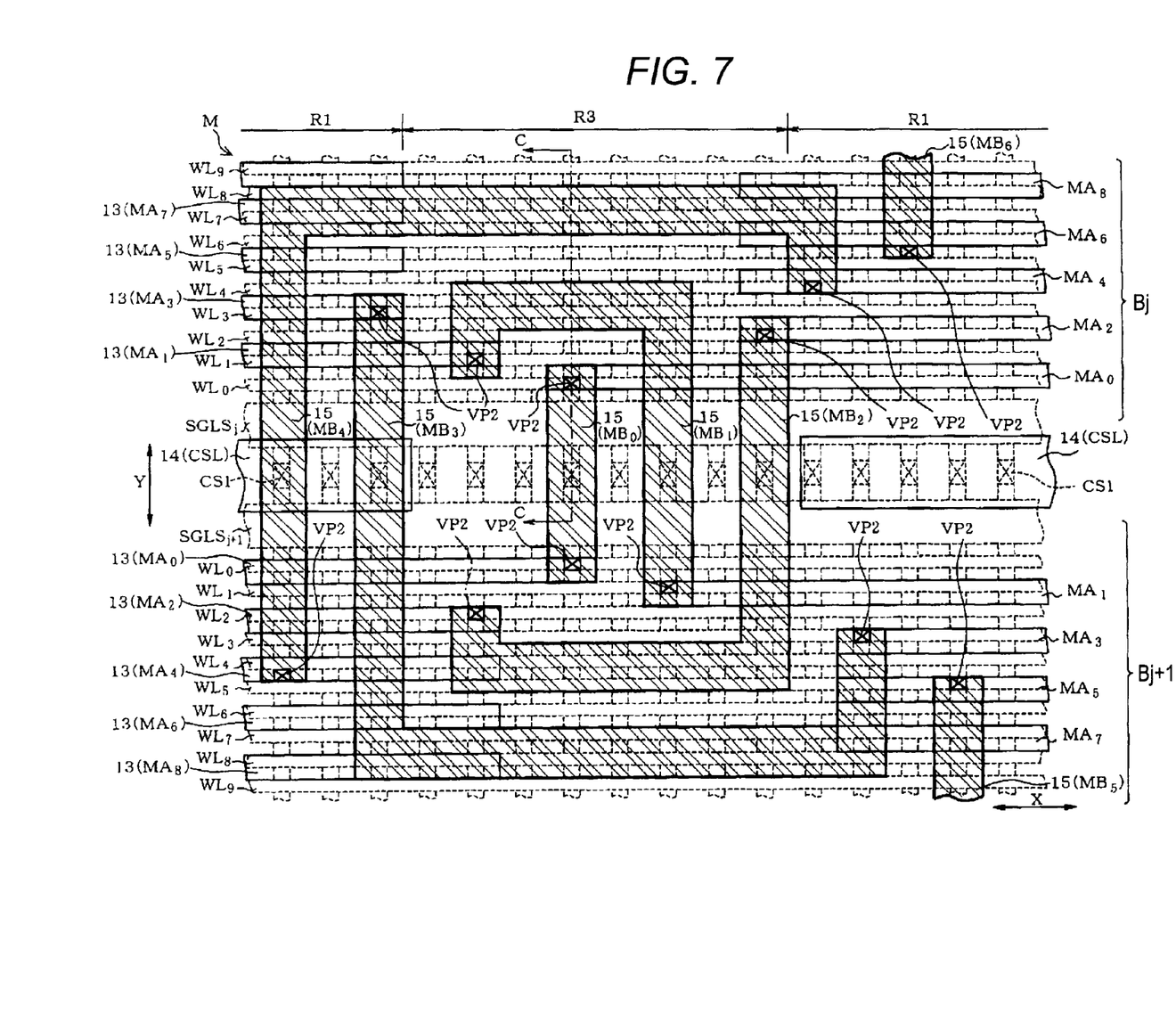
FIG. 7 is a plan diagram schematically illustrating a word line connection structure in an intermediate area of a memory cell area.
Figure 8:
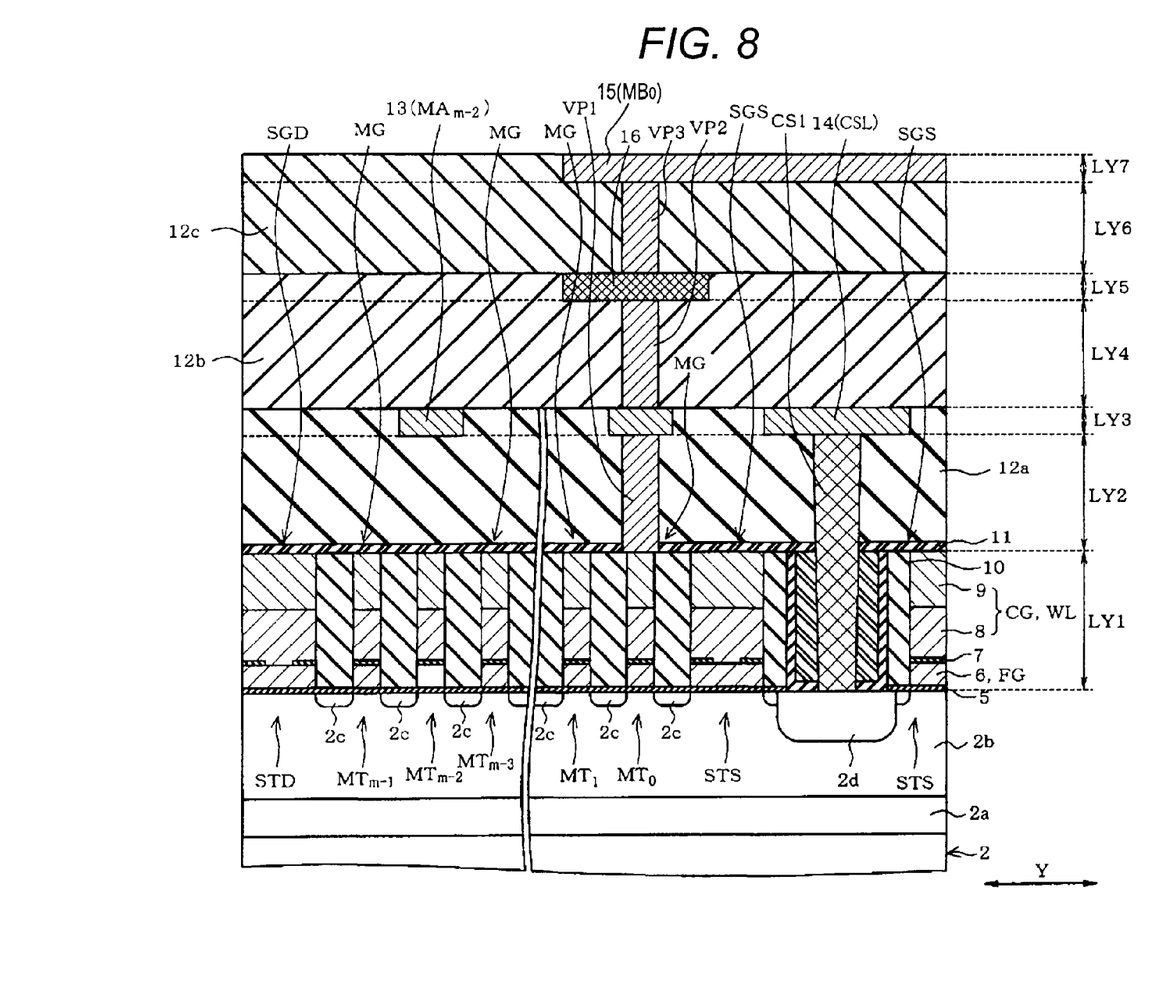
FIG. 8 is a vertical cross-sectional diagram taken along line C-C shown in FIG. 7.

FIG. 7 schematically illustrates the planar configuration of via-plugs VP2 and wirings 15 formed in the layers LY4 to LY7, in a source shunt area (intermediate area) of the memory cell area. FIG. 8 illustrates a vertical cross-sectional diagram taken along line C-C shown in FIG. 7. In FIG. 7, the wirings 15 formed in the layer LY7 are shown by being hatched. In the memory cell area M, the intermediate areas R3 are provided to periodically equalize the voltage of the source line CSL in X-direction and Y-direction. The electrical components, such as the gate electrodes MG, SGD and SGS, formed in the area R3 are provided as dummy cells that do not function as electric elements of the memory cell units. In the cell array area R1, the wiring 14 is formed on the source line contacts CS1. And, the wiring 14 is divided at the intermediate area R3.

As illustrated in FIG. 7, the wirings 13 ($MA_0$ to $MA_{m-1}$) are formed so as to extend in X-direction. The wirings 13 are divided so that the end portions thereof are positioned around the area R3. In one of the areas R1, the even-numbered wirings $MA_0$ . . . are formed in the block $B_j$. In the other of the areas R1, the even-numbered wirings $MA_0$ . . . are formed in the adjacent block $B_{j+1}$. And, in the intermediate area R3, the even-numbered wirings $MA_0$ . . . in the blocks $B_{j+1}$ and $B_j$ are connected by the wirings $MB_0$ . . . . Similarly, in one of the areas R1, the odd-numbered wirings $MA_1$ . . . are formed in the block $B_{j+1}$. In the other of the areas R1, the odd-numbered wirings $MA_1$ . . . are formed in the adjacent block $B_j$. And, in the intermediate area 3, the odd-numbered wirings $MA_1$ . . . in the blocks $B_{j+1}$ and $B_j$ are connected by the wirings $MB_1$ . . . . That is, the wirings 13 are configured so that the even-numbered and odd-numbered wirings are switched between the adjacent block $B_{j+1}$ and $B_j$ at the intermediate area R3.

By providing such switching structure, the resistance of the word lines WL can be further reduced without increasing a chip size.

As illustrated in FIGS. 7 and 8, the wiring $MA_0$ in the block $B_j$ extends to the intermediate area R3, and the via-plug VP2 formed in the layer LY4 is connected to an end portion of the wiring $MA_0$. The via-plug VP2 is connected to the wiring $MB_0$ formed in the layer LY7 via the wiring 16 formed in the layer LY5 and the via-plug VP3 formed in the layer LY6. The wiring $MB_0$ extends linearly to the block $B_{j+1}$ in Y-direction (i.e., a direction in which the active areas extends) shown in FIG. 7. The wiring $MB_0$ is connected to an end portion of the wiring $MA_0$ in the block $B_{j+1}$ via the via-plug VP3 formed in the layer LY6, the wiring 16 formed in the layer LY5 and the via-plug VP2 formed in the layer LY4.

Similarly, the wirings $MA_1$ . . . are respectively connected to the wirings $MB_1$ . . . through the via-plugs VP2, the wirings 16, and the via-plugs VP3. Thus, the wirings are switched between the adjacent blocks $B_j$ and $B_{j+1}$. The wirings 15 are formed to have an "L"-like shape around the wiring $MB_0$ so as not to intersect with one another.

Since, the wirings $MB_0$ . . . are formed wider (e.g., twice or triple wider) than the wirings $MA_0$ . . . , the misalignment in the lithography processing can be mitigated, and the resistance value of each of the word lines WL can be reduced.

Figure 9:
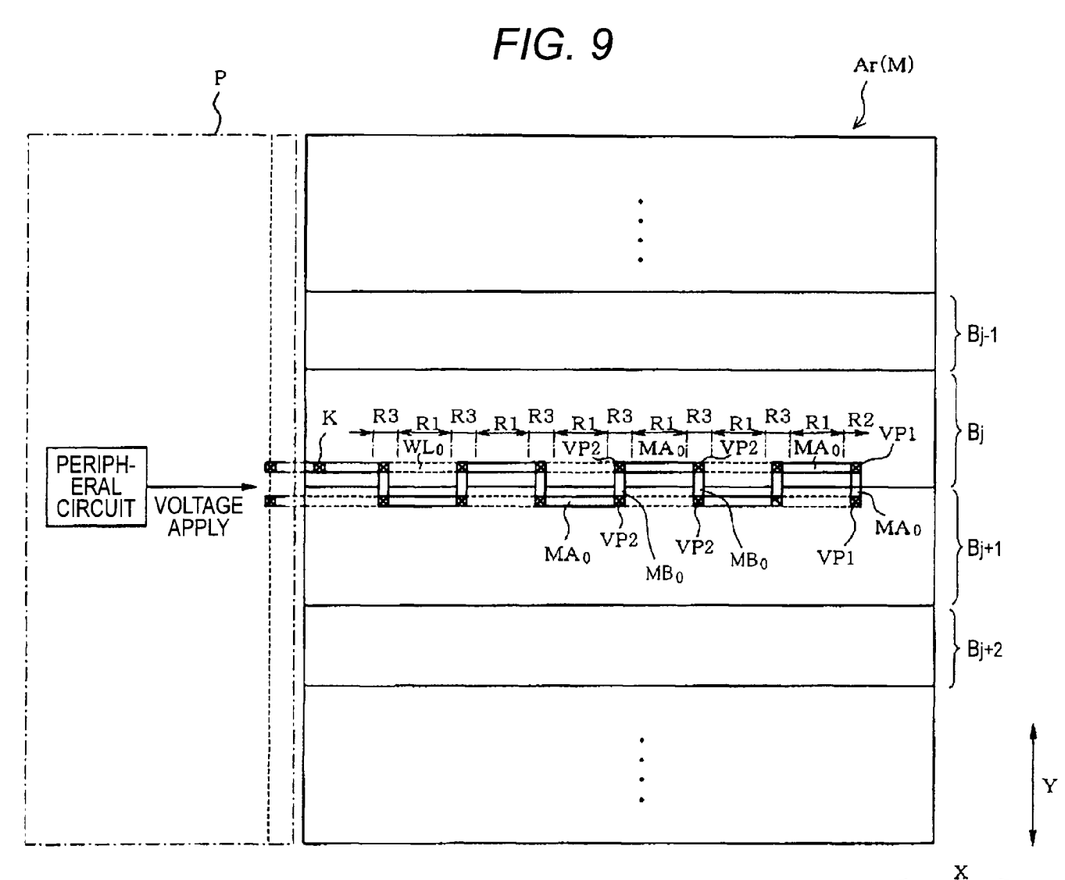
FIG. 9 is a plan diagram schematically illustrating the positional relationship between each area in the entire memory cell area and a voltage applying portion in a word line.

FIG. 9 illustrates the wiring pattern of the wiring MA0 from the memory cell array Ar to the peripheral circuit area P.

As illustrated in FIG. 8, the wiring $MA_0$ is disposed in the cell array areas R1 serially adjoining in X-direction so as to belong alternately to one or the other of the adjacent blocks, and as to be connected to peripheral circuits of the peripheral circuit area P via the voltage applying portion K. In the dummy area R2, the word line $WL_0$ belonging to the block $B_j$ and the word line $WL_0$ belonging to the block $B_{j+1}$ are structurally connected to each other by the via-plug VP1 and the wiring $MA_0$ extending in Y-direction shown in FIG. 9. In each intermediate area R3, the word line $WL_0$ belonging to the block $B_j$ and the word line $WL_0$ belonging to the block $B_{j+1}$ are structurally connected to each other by the via-plug VP2 and the wiring $MB_0$ extending in Y-direction shown in FIG. 9.

Figure 10A:
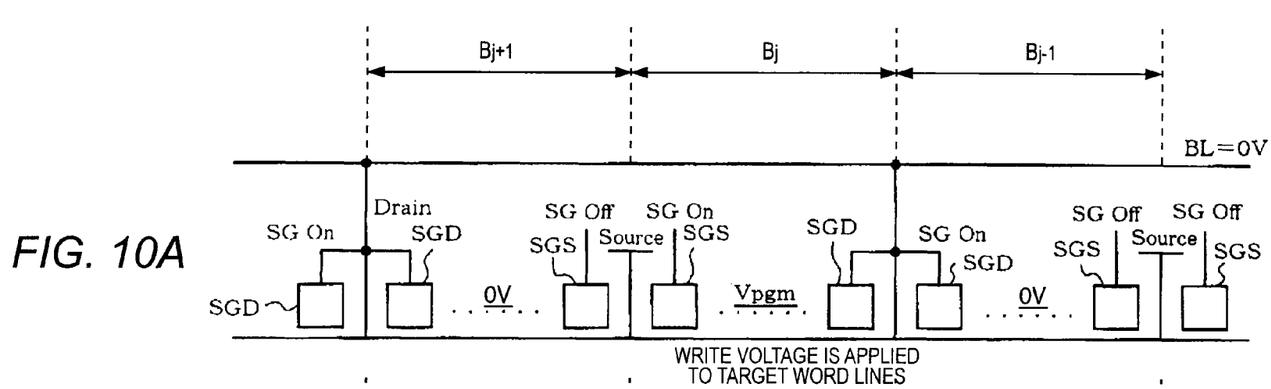
FIGS. 10A and 10B are explanatory diagrams each schematically illustrating voltage to be applied to a write target word line by a peripheral circuit.
Figure 10B:
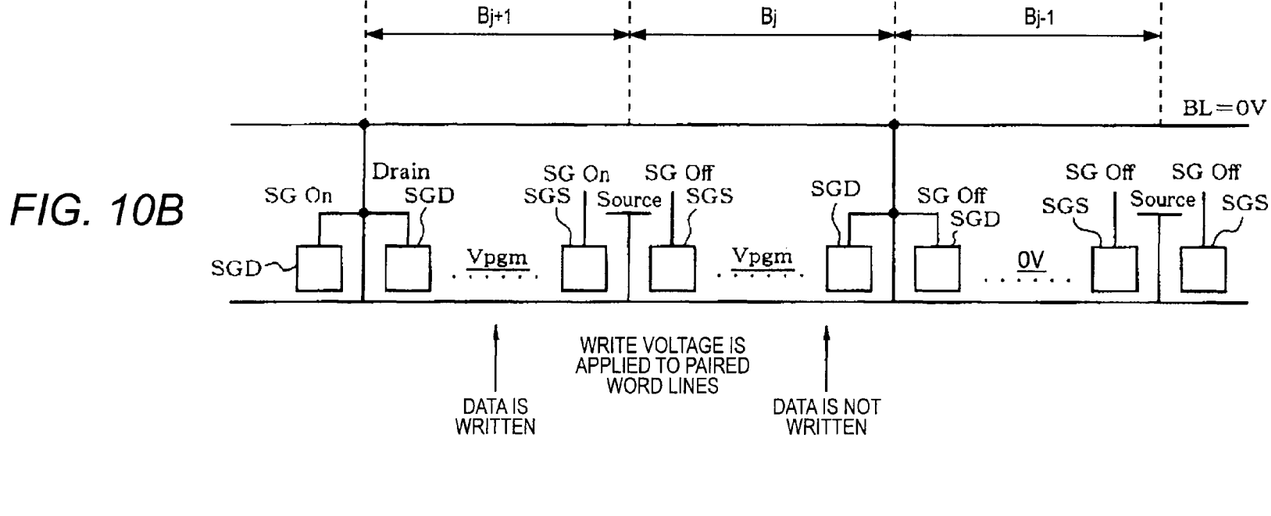

FIGS. 10A and 10B schematically illustrate a voltage to be applied to the word lines in each of the blocks when the peripheral circuit applies a write voltage to the word line of a write target. FIG. 10A illustrates an NAND flash memory having a normal word line structure in a state where voltage is applied to a write target word line. FIG. 10B illustrates an NAND flash memory having the embodiment word line structure in a state where voltage is applied to a write target word line.

As illustrated in FIG. 10A, the peripheral circuit applies a ground voltage (0 V) to the bit line BL ($BL_0$ to $BL_{n-1}$) to which a cell unit UC including a memory cell transistor MT of the write-target is connected. The peripheral circuit turns on the drain-side select gate electrode SGD of the cell unit UC, and turns off the source-side select gate electrode SGS of the cell unit US. Then, the peripheral circuit applies a write voltage $V_{pgm}$ (e.g., 20 v) to the voltage applying portion K of the word line WL of the write target, the peripheral circuit applies a ground voltage (0 V) or an intermediate-level voltage to the voltage applying portion K of the word line WL of a non-write-target, and the peripheral circuit applies a ground voltage to the P-well 2b, thereby providing a positive high voltage to between the word line WL ($WL_0$ to $WL_{m-1}$) connected to the write-target memory cell transistor MT and the P-well $2b$. Consequently, electrons are injected into the floating gate electrode FG, so that data is written to the write-target memory cell transistor MT ($MT_0$ to $MT_{m-1}$).

In the embodiment, as illustrated in FIG. 10B, when the peripheral circuit applies a high-level voltage (e.g., 20V) to the write-target word line WL in one of the adjacent blocks $B_j$ and $B_{j+1}$, the high-level voltage is also applied to the word line having the same number in the other of the adjacent blocks. For example, even if each drain-side select gate electrode SGD is commonly-connected in the adjacent blocks $B_j$ and $B_{j+1}$, when the source-side select gate electrodes SGS are formed separately from each other as illustrated in FIG. 10B, the date can be independently wrote into the memory cell transistor MT of the block $B_{j+1}$, and a fear of writing data to the memory cell transistor MT of the adjacent block $B_j$ can be eliminated, by appropriately adjusting the voltage applied thereto. For example, in the block $B_j$, the drain-side select gate transistor STD of the block $B_j$ may be turned off. Further, on/off or magnitude of the voltage applied to the select gate electrode SGS, the well $2b$ and the like may be adjusted.

In the embodiment, the adjacent blocks $B_j$ and $B_{j+1}$ are provided in parallel in Y-direction. Numbers assigned to the word lines WL ($WL_0$ to $WL_{m-1}$) formed in each of the blocks $B_j$ and $B_{j+1}$, between which a group of source line contacts (conductive members provided between the blocks $B_j$ and $B_{j+1}$) is interposed, are set such that the same number is assigned to a pair of the word lines which respectively belong to the adjacent blocks $B_j$ and $B_{j+1}$ and are provided in Y-direction symmetrically with respect to the group of source line contacts CS. In the adjacent blocks $B_j$ and $B_{j+1}$, the word lines WL ($WL_0$ to $WL_{m-1}$) having the same number are structurally and electrically connected to each other by a plurality of upper layers (in the embodiment, the layers LY3 to LY5), at a position different from the voltage applying portion K. Consequently, the resistance value of each word line WL ($WL_0$ to $WL_{m-1}$) can be reduced, and deterioration in the write characteristics due to a signal delay can be prevented.

In the word lines WL ($WL_0$ to $WL_{m-1}$), the voltage applying portion K of the peripheral circuit is set at one end side in the memory cell area M (i.e., at the side of a leftmost peripheral circuit area P in the memory cell area M shown in FIG. 9). However, each of the wirings $MA_0$ ... structurally connects the associated word lines WL ($WL_0$ to $WL_{m-1}$) having the same number of each of the blocks $B_j$ and $B_{j+1}$ to each other, around the area R2 at the other end side (i.e., the rightmost end, as viewed in FIG. 9) opposite to the one end side. Consequently, the resistance value of each word line WL ($WL_0$ to $WL_{m-1}$) can be reduced, and the deterioration of the write characteristics due to the signal delay can be prevented, because the word lines WL having the same number are structurally connected to each other at the other end side (i.e., at the side of the rightmost end area R2 shown in FIG. 9), at which the signal delay is tend to be pronounced.

The wirings $MA_0$ ... formed in the layer LY3 are formed so as to have a width in Y-direction larger (e.g., twice larger) than that of each word line WL ($WL_0$ to $WL_{m-1}$) formed in the layer LY1. The word lines having the same number are connected to each other via the via-plug VP1 by an associated one of the wirings MA0 .... Consequently, the resistance value of each of the word lines WL ($WL_0$ to $WL_{m-1}$) can be reduced, and deterioration of the write characteristics due to the signal delay can be prevented.

Each of the wirings $MA_0$ ... is provided so as to extend above the associated word lines having the same number at least in a part of the area R1. Each of the even-numbered wirings $MA_0$ ... extends above the associated word lines having the same number WL ($WL_0$ to $WL_{m-1}$) in the block $B_j$, and each of the odd-numbered wirings $MA_1$ ... extends above the associated word lines having the same number WL ($WL_0$ to $WL_{m-1}$) in the block $B_{j+1}$. Consequently, the wide wiring $MA_0$ ... can be periodically and easily connected in X-direction to the associated word lines WL ($WL_0$ to $WL_{m-1}$). Further, occurrence of a failure, at which the even-numbered wirings $MA_0$ ... are structurally contacted with the odd-numbered wirings $MA_1$ ..., can be prevented.

The wirings are configured to be switched from one of the adjacent blocks $B_j$ and $B_{j+1}$ having the even-numbered wirings $MA_0$ ... to the other thereof having the odd-numbered wirings $MA_1$ ..., around the intermediate areas R3. The intermediate areas R3 are provided to have intervals which are short as compared with a length in X-direction of the word lines WL ($WL_0$ to $WL_{m-1}$). The wirings $MB_0$ ... are configured to structurally and electrically connect the even-numbered wirings $MA_0$ ... and the odd-numbered wirings $MA_1$ ... in the upper layer LY7. Further, the wirings $MB_0$ ... are constructed so that the width in Y-direction of each of the wirings $MB_0$ ... are wider than that of each of the wirings $MA_0$ .... Consequently, the voltage level can be uniformed. Further, the resistance value of each of the word lines WL ($WL_0$ to $WL_{m-1}$) can be reduced, the voltage drop in each of the word lines WL ($WL_0$ to $WL_{m-1}$) can be prevented, and the deterioration in the write characteristics due to the signal delay can be prevented.

The word lines WL ($WL_0$ to $WL_{m-1}$) are constructed so that the word lines WL ($WL_0$ to $WL_{m-1}$) having the same number respectively included in the adjacent blocks $B_j$ and $B_{j+1}$ are connected to each other by a structure formed above the dummy contact area CSD, in which the dummy source line contacts CS are formed, so as to overlap with the dummy contact area CSD in plan view. Consequently, write voltage can normally be applied to the word lines.

Other Embodiments

The invention is not limited to the previously mentioned embodiment. For example, the following modifications can be applied.

Although, in the aforementioned embodiment, the word lines WL ($WL_0$ to $WL_{m-1}$) are structurally and electrically connected by use of the conductive members of the plural upper layers LY3 to LY5, the conductive members of a single upper or lower layer may be used.

Although, in the aforementioned embodiment, the word lines WL ($WL_0$ to $WL_{m-1}$) are structurally and electrically connected in both of the intermediate area R3 and the dummy area R2, the word lines WL ($WL_0$ to $WL_{m-1}$) may be structurally and electrically connected in one of the intermediate area R3 and the dummy area R2 so that the word lines are structurally connected to each other not only at the voltage applying portion K but also at a position differing from the voltage applying portion K. It is effective to structurally connect the word lines in both of the intermediate area R3 and the dummy area R2 for reducing the resistance.

Although, in the aforementioned embodiment, the word lines WL ($WL_0$ to $WL_{m-1}$) extending above the dummy contact area CSD in the dummy area R2 are structurally connected to each other, the word lines may be formed to extend above the area in which the drain-side bit line contacts CB are formed so as to be structurally connected. In this case, the voltages to be applied by the peripheral circuit to the gate electrodes SGD and SGS of the select gate transistor STD and STS are adjusted appropriately.

Although, in the aforementioned embodiment, the voltage applying portion K are formed only at one end side in X-direction of the memory cell array Ar shown in the drawing, peripheral circuits may be formed at both sides of the memory cell array Ar, and voltage applying portions K may be provided at both ends in X-direction of the memory cell array Ar.

Although, in the aforementioned embodiment, the memory cell array Ar has a single plane configuration, the memory cell array Ar can be divided into two or more planes. Even in a case where the length of each of the word lines is short, as compared with that of each of the word lines of the aforementioned embodiment, the resistance of the wiring is increased when the width of each of the word lines WL is reduced with the recent shrinkage of the design rule. Therefore, it is effective to apply the embodiment structure for the word lines WL for reducing the resistance value of the wiring.

Although, the aforementioned embodiment is exemplified with the flash memory 1, the embodiment can be applied to another type of a semiconductor device having a structure in which the word lines WL extend in a given direction.

According to an aspect of the present invention, the resistance values of word lines can be reduced, and deterioration of write characteristics of a memory cell due to the signal propagation delay can be prevented.

The invention claimed is:

1. A semiconductor device comprising:
first and second blocks that each includes a word line group of first to N-th word lines, N being integer equal to or larger than 2, the word lines extending in a given direction in parallel with one another in a crossing direction intersecting with the given direction, the word lines having a first width, the first and second blocks being adjacent to and in parallel with each other in the crossing direction so that an inter-block area is interposed therebetween and so that the word line groups are symmetrical with respect to the inter-block area; and
a plurality of first wirings that are formed in a first wiring layer positioned above the word lines to have a second width wider than the first width and that connect a k-th word line of the first block and a k-th word line of the second block, k being integer equal to or larger than 1 and lower than or equal to N.

2. The semiconductor device according to claim 1,
wherein the first wirings each includes an extending portion that extends in the given direction above the word lines,
wherein, in one of the first and second blocks, the extending portions respectively correspond to even-numbered word lines, and
wherein, in the other of the first and second blocks, the extending portions respectively correspond to odd-numbered word lines.

3. The semiconductor device according to claim 2,
wherein the first and second blocks each includes:
a first area including a memory cell array;
a second area including another memory cell array and being aligned with the first area along the given direction; and
an intermediate area sandwiched therebetween,
wherein, in the first block, the extending portions respectively corresponds to the even-numbered word lines in the first area and to the odd-numbered word lines in the second area,
wherein, in the second block, the extending portions respectively corresponds to the odd-numbered word lines in the first area and to the even-numbered word lines in the second area, and
wherein a plurality of second wirings formed in a second wiring layer are provided in the intermediate area so as to connect the extending portions in the first area of the first block to the extending portions in the second area of the second block and so as to connect the extending portions in the first area of the second block to the extending portions in the second area of the first block.

4. The semiconductor device according to claim 3, further comprising:
a plurality of source line contacts that are disposed between the first block and the second block; and
a source wiring that is formed in the first wiring layer and that connects the source line contacts,
wherein the source wiring is divided at the intermediate area.

5. The semiconductor device according to claim 3,
wherein a plurality of bit lines formed in a third wiring layer are provided in the first and second blocks to extend in the crossing direction,
wherein the third wiring layer is positioned above the first wiring layer, and
wherein the second wiring layer is positioned above the third wiring layer.

6. The semiconductor device according to claim 1,
wherein the first wirings each includes a connecting portion extending in the crossing direction in end portions of the first and second blocks, and
wherein the connecting portion connects the k-th word line of the first block and the k-th word line of the second block through via-plugs.

7. The semiconductor device according to claim 1, further comprising:
an inter-layer insulating film covering the word lines,
wherein the first wirings are formed on the inter-layer insulating film.

8. A semiconductor device comprising:
a semiconductor substrate;
a first block including:
a plurality of first memory cell transistors arranged in matrix; and
a plurality of first word lines connecting the first memory cell transistors in a first direction;
a second block including:
a plurality of second memory cell transistors that are adjacent to the first block in a second direction intersecting the first direction and that are arranged in matrix; and
a plurality of second word lines connecting the second memory cell transistors in the first direction; and
a plurality of first wirings that are formed in a first wiring layer positioned above the first word lines and the second word lines and that respectively connect a k-th one of the first word lines and a k-th one of the second word lines, k being integer equal to or larger than 1 and lower than or equal to N.

9. The semiconductor device according to claim 8,
wherein the first wirings each includes:
an extending portion that extends in the first direction and that is connected to one word line of the first and second word lines; and
a connecting portion that extends in the second direction from the extending portion and that is connected to another one word line of the first and second word lines.

10. The semiconductor device according to claim 9,
wherein the first word lines and the second word lines are N word lines, N being integer equal to or larger than 2, wherein, in the first block, the extending portions corresponds to even-numbered first word lines, and wherein, in the second block, the extending portions corresponds to odd-numbered second word lines.

11. The semiconductor device according to claim 9, wherein the first and second blocks each includes:
   a first area including a part of the memory cell transistors;
   a second area including another part of the memory cell transistors; and
   an intermediate area sandwiched therebetween,
   wherein the first word lines and the second word lines are N word lines, N being integer equal to or larger than 2,
   wherein, in the first block, the extending portions are connected to even-numbered first word lines in the first area and the odd-numbered first word lines in the second area, and
   wherein, in the second block, the extending portions are connected to odd-numbered second word lines in the first area and the even-numbered second word lines in the second area.

12. The semiconductor device according to claim 11, further comprising:
   a plurality of source line contacts that are disposed between the first block and the second block; and
   a source wiring that is formed in the first wiring layer and that connects the source line contacts,
   wherein the source wiring is divided at the intermediate area.

13. The semiconductor device according to claim 11, further comprising:
   a plurality of second wirings that are formed in a second wiring layer and that are connected to the first wirings in the intermediate area,
   wherein the second wirings connect the first wirings in the first area of the first block and the first wirings in the second area of the second block, and
   wherein the second wirings connect the first wirings in the first area of the second block and the first wirings in the second area of the first block.

14. The semiconductor device according to claim 13, wherein the second wirings connect the odd-numbered first word lines to the odd-numbered second word lines through the first wirings, and connect the even-numbered first word lines to the even-numbered second word lines through the first wirings.

15. The semiconductor device according to claim 11, further comprising:
   a plurality of bit lines formed in a third wiring layer to extend in the second direction,
   wherein the second wiring layer is positioned above the third wiring layer.

16. The semiconductor device according to claim 9,
   wherein the first word lines and the second word lines are N word lines, N being integer equal to or larger than 2, and
   wherein the connecting portions each connects the word line and the second word line having the same number.

17. The semiconductor device according to claim 9, wherein the connecting portions are connected to the first word lines and the second word lines through via plugs.

18. The semiconductor device according to claim 9, wherein the connecting portions connect the first word lines and the second word lines at end portions of the first and second blocks.

19. The semiconductor device according to claim 8,
   wherein the first word lines and the second word lines have a first width,
   wherein the first wirings have a second width, and
   wherein the second width is wider than the first width.

20. The semiconductor device according to claim 19, wherein the first width and the second width are determined based on a design rule.

* * * * *